United States Patent
Huang et al.

(10) Patent No.: US 7,205,817 B1
(45) Date of Patent: Apr. 17, 2007

(54) ANALOG CONTROL INTEGRATED FET BASED VARIABLE ATTENUATORS

(75) Inventors: Feng-Jung Huang, Nashua, NH (US); Jean-Marc Roger Mourant, Groton, MA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 11/280,683

(22) Filed: Nov. 16, 2005

Related U.S. Application Data

(62) Division of application No. 10/815,155, filed on Mar. 30, 2004, now abandoned.

(51) Int. Cl.
*H03L 5/00* (2006.01)

(52) U.S. Cl. .................................................... 327/308
(58) Field of Classification Search ................ 327/308, 327/374–377; 333/81 R, 81 A, 81 B
See application file for complete search history.

(56) References Cited

U.S. PATENT DOCUMENTS 4,837,530 A * 6/1989 Kondoh .................... 333/81 A 6,870,241 B2 * 3/2005 Nakatani et al. ............. 257/531

OTHER PUBLICATIONS

Huang, Feng-Jung et al., "A 900-MHz T/R Switch with a 0.8-dB Insertion Loss Implemented in a 0.5-μm CMOS Process", IEEE 2000 Custom Integrated Circuits Conference.
Huang, Feng-Jung et al., "A 0.5-μm CMOS T/R Switch for 900-MHz Wireless Applications", IEEE Journal of Solid-State Circuits, Mar. 2001, vol. 36, No. 3, pp. 486-492.

* cited by examiner

*Primary Examiner*—My-Trang Nu Ton
(74) *Attorney, Agent, or Firm*—Blakely Sokoloff Taylor & Zafman LLP

(57) ABSTRACT

Analog control integrated FET based variable resistors and attenuators using the variable resistors having a wide range of monotonic and substantially linear attenuation with control voltage for use in circuits having AC signals of AC signal frequencies. The variable resistors comprise field effect devices (FETs) biased to operate in their linear region and having their bodies and gates coupled to a reference voltage and a control voltage, respectively, through impedances, typically resistors, having impedances that are higher than the impedances of parasitic capacitances at the signal frequencies. This allows the body and gate of each FET to vary in voltage with the signal to maintain the bias of the FETs in the presence of large signals. Various embodiments are disclosed.

20 Claims, 15 Drawing Sheets

ANALOG CONTROL INTEGRATED FET BASED VARIABLE ATTENUATORS

CROSS-REFERENCE TO RELATED APPLICATION

This application is a divisional of application Ser. No. 10/815,155, filed Mar. 30, 2004 now abandoned.

BACKGROUND OF THE INVENTION

1. Field of the Invention

The present invention relates to the field of analog attenuators.

2. Prior Art

Variable analog attenuators are commonly used in applications which require signal level control, such as, by way of example, in radio frequency (RF) automatic gain control (AGC) circuits. Typically discrete PIN diodes are used for this purpose. A PIN diode differs from an ordinary PN diode in that there is an intrinsic semiconductor region (I) between the P and N doped regions of the diode. When a forward bias is applied to the diode, a large number of electrons and holes are created in the intrinsic region, allowing forward conduction. If the bias is suddenly removed, these charge carriers will not immediately recombine, and thus will not immediately stop the conduction current. Thus PIN diodes will conduct high frequency signals superimposed on a bias current without much distortion, even for large signals that would cause a momentary reversal of the PIN diode current. However the present invention performs the desired function, but being part of an integrated circuit, is smaller, less expensive, has less power consumption and provides constant attenuation versus control voltage slope when compared to conventional discrete PIN diode based analog attenuators.

BRIEF DESCRIPTION OF THE DRAWINGS

FIGS. 7b through 7d graphically illustrate large signal effects on the transistor of FIG. 7a.

FIGS. 8b and 8c graphically illustrate large signal effects on the transistor of FIG. 7a as biased as in FIG. 8a.

DETAILED DESCRIPTION OF THE PREFERRED EMBODIMENTS

I. Analog Control Integrated Field-Effect-Transistor Based Attenuator

Figure 1A:
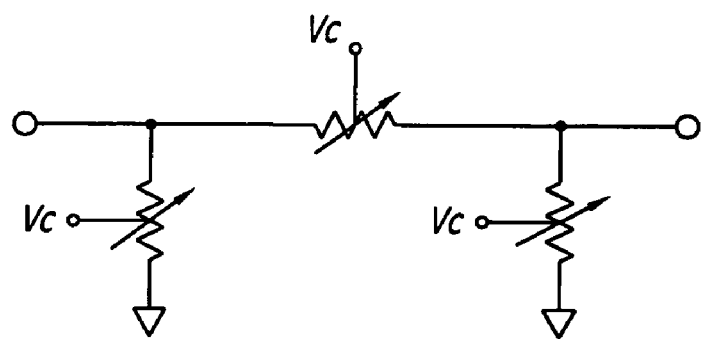
FIGS. 1a and 1b show simplified diagrams of integrated FET analog attenuators in accordance with the present invention.
Figure 1B:
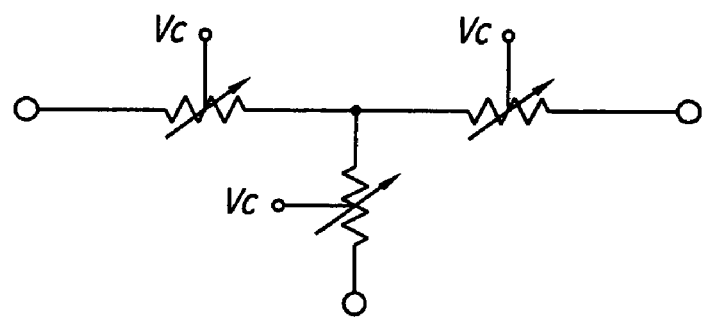
Figure 1C:
FIGS. 1c and 1d show two specific possible configurations for the voltage controlled variable resistors for the attenuators of FIGS. 1a and 1b.
Figure 1D:
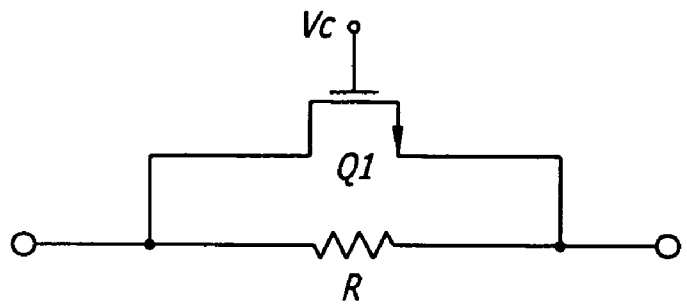

FIGS. 1a and 1b show simplified diagrams of integrated FET analog attenuators in accordance with the present invention. The attenuation or insertion loss of these analog attenuators is controlled by the impedance of the voltage controlled variable resistors shown in FIGS. 1a and 1b. There are several possible configurations for the voltage controlled variable resistors. Two examples are shown in FIGS. 1c and 1d. The control signal Vc (also see FIGS. 1a and 1b) controls the on-resistance of the transistors to change the total impedance $R_T$ of the variable resistors by turning the transistors on, off and partially on/off. For the configuration of FIG. 1c, the total resistance when the FET Q1 is on is $R_T = R + R_{ON}$, where $R_{ON}$ is the on resistance of the FET Q1, and the total resistance will be very large when the FET is off. For the configuration of FIG. 1d, the total resistance when the FET Q1 is on is $R_T=(R)(R_{ON})/(R+R_{ON})$ and the total resistance when the FET is off is R.

Figure 2A:
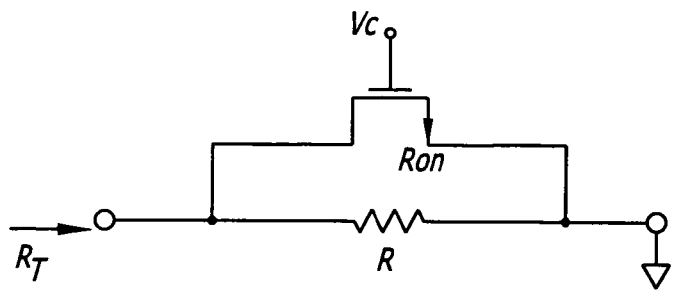
FIGS. 2a and 2b show a voltage controlled variable resistor and a curve illustrating the total resistance $R_T$ versus the control voltage Vc for that voltage controlled variable resistor, respectively.
Figure 2B:
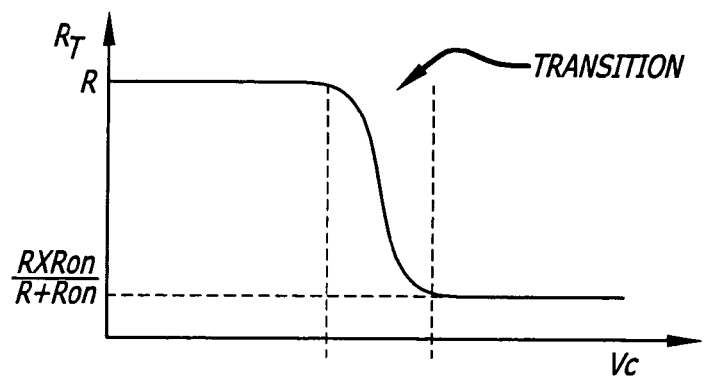
Figure 2C:
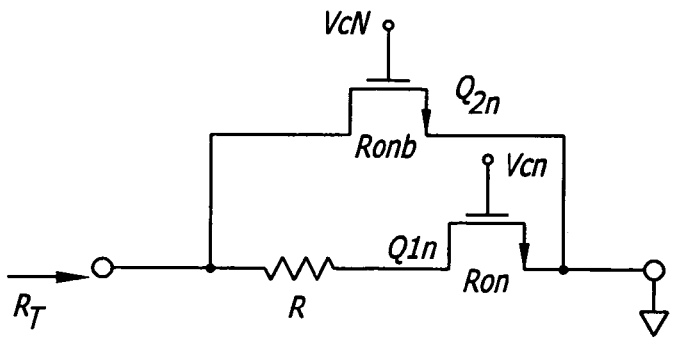
FIGS. 2c and 2d show another voltage controlled variable resistor and a curve illustrating the total resistance $R_T$ versus the control voltage Vc for that voltage controlled variable resistor, respectively.
Figure 2D:
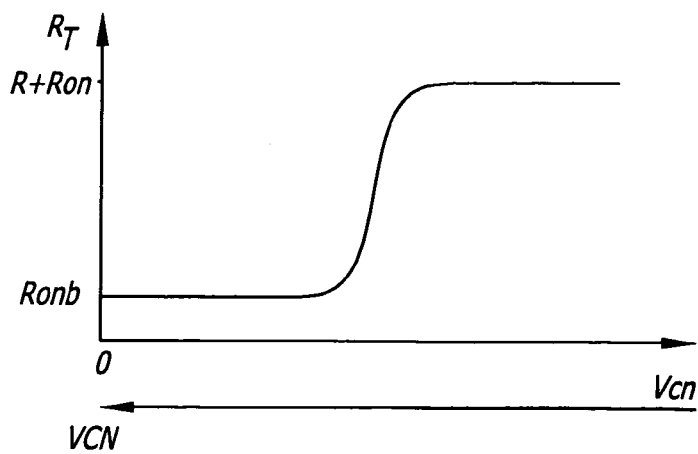

By changing Vc to alter the on-resistance of the transistors, the total resistance $R_T$ can be varied. The examples of total resistance $R_T$ versus the control voltage Vc for the configuration of FIG. 1d (see also FIG. 2a) is illustrated graphically in FIG. 2b. FIG. 2c presents still another FET variable resistance circuit with FET transistors Q1n and Q2n. Transistor Q2n is controlled by the voltage VcN, where VcN is an inverse or opposite (as shall be more fully illustrated later herein) of the voltage Vcn controlling the transistor Q1n. As transistor Q1n is turned on, transistor Q2n is turned off, and vise versa. The examples of total resistance $R_T$ versus the control voltage Vcn for the configuration of FIG. 2c is illustrated graphically in FIG. 2d. As shown in FIGS. 2b and 2d, total resistance $R_T$ versus control voltage Vcn can be roughly divided into three states, namely a higher impedance state, a lower impedance state and a transition state. By using these three states of variable resistors, an analog voltage control π-attenuator (FIG. 1a) or a T-attenuator (FIG. 1b) can be developed.

Figure 3A:
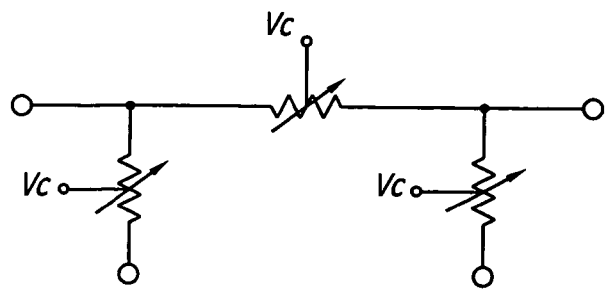
FIGS. 3a and 3b present schematics of a π-attenuator and a T-attenuator, respectively, in accordance with the present invention.
Figure 3B:
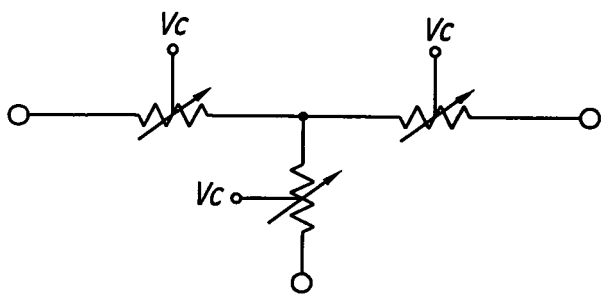
Figure 3C:
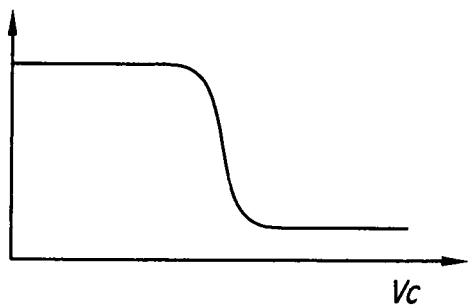
FIG. 3c presents a curve illustrating the characteristics of insertion loss or attenuation versus the control voltage Vc for the circuits of FIGS. 3a and 3b.

Schematics of a π-attenuator and a T-attenuator in accordance with the present invention are shown in FIGS. 3a and 3b, respectively. Each variable resistor in the attenuators should be properly configured by using different types of variable resistors, such as those shown in FIGS. 1c, 1d and/or 2c in order to perform the desired function for the attenuator. FIG. 3c generally shows the characteristics of insertion loss or attenuation versus the control voltage Vc for the circuits of FIGS. 3a and 3b. The attenuation can be controlled by changing Vc to achieve the desired attenuation level. However as illustrated in FIG. 3c, the slope of attenuation versus the control voltage $V_C$ during transition is not constant. This is mainly due to the nonlinear total resistance $R_T$ versus control voltage Vc of the variable resistors. In addition, the transition is usually sharp.

Figure 3D:
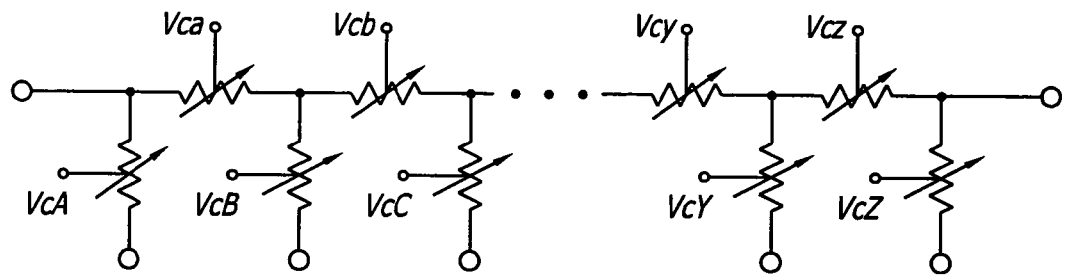
FIGS. 3d and 3e illustrate a multiple stage attenuator (multiple attenuators in cascade) with a proper control signal for each variable resistor, and the constant slope of attenuation (in dB) versus control voltage Vc that can be obtained with such a multiple stage attenuator, respectively.
Figure 3E:
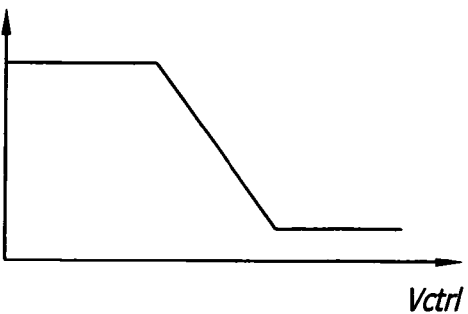
Figure 4A:
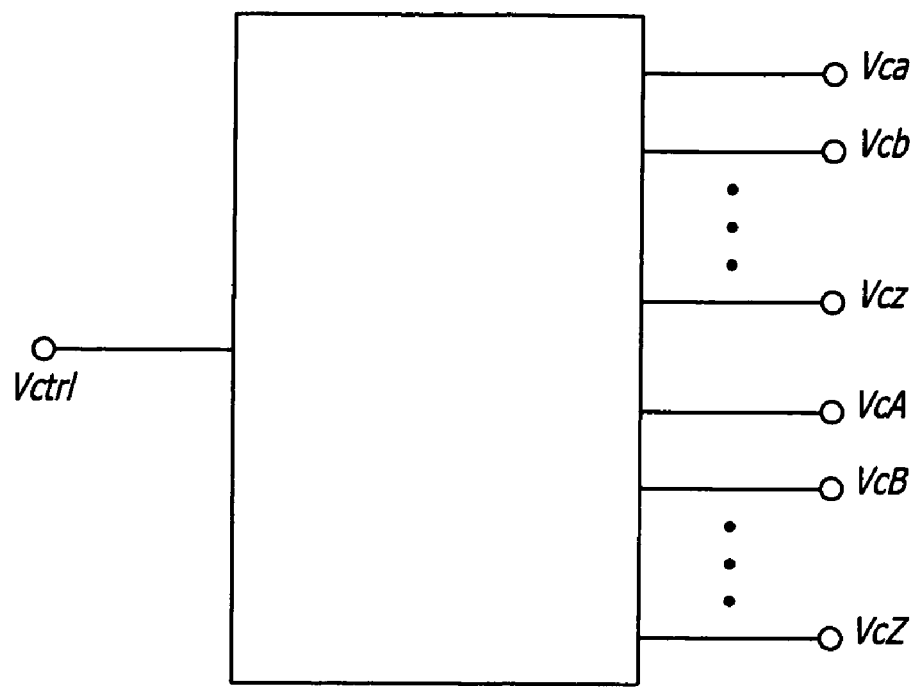
FIGS. 4a and 4b generally illustrate the control signal for each variable resistor as generated from an attenuation control voltage (Vctrl), and a set of sample control signals versus Vctrl, respectively.
Figure 4B:
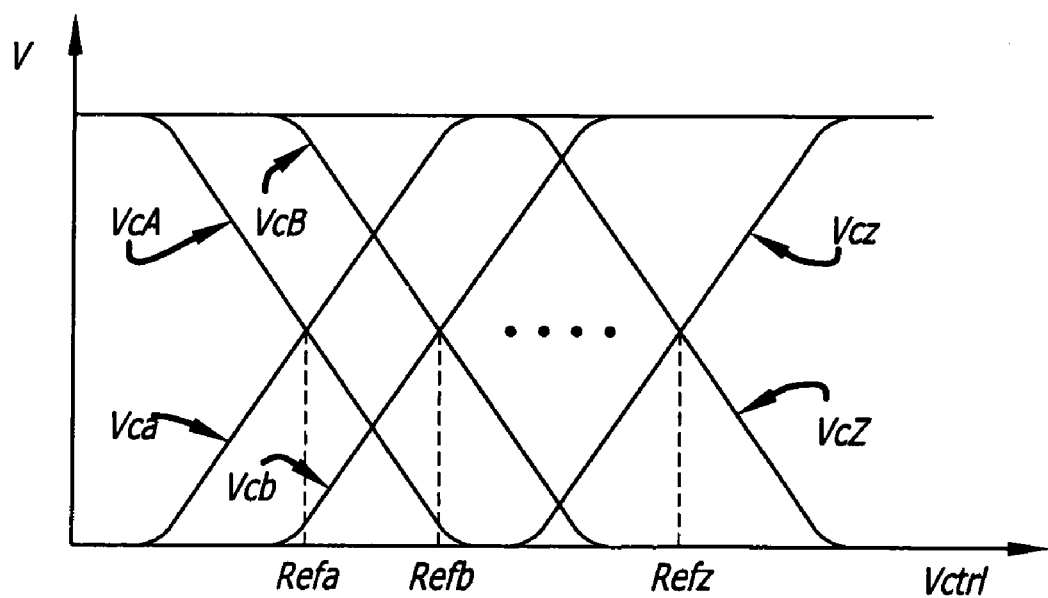

The non-constant slope of attenuation and sharp transition versus control voltage as shown in FIG. 3c is usually not desired. One possible solution for that is to use multiple attenuators in cascade (a multiple stage attenuator) as shown in FIG. 3d, with a proper control signal for each variable resistor. Typically in such an attenuator, all series variable resistors will be of the same circuit configuration and device sizing, and all shunt variable resistors will be of the same circuit configuration and device sizing, except the first and last shunt resistors, though this is not a limitation of the invention. By using this configuration and control, a constant slope of attenuation (in dB) versus control voltage Vc can be obtained, as shown in FIG. 3e. The key to achieve this constant slope during transition are the individual control signals for each of the variable resistors, Vca, Vcb . . . Vcy, Vcz (no specific number of stages implied). The control signal for each variable resistor is generated from an attenuation control voltage (Vctrl), as shown schematically in FIG. 4a. A set of sample control signals versus Vctrl is shown in FIG. 4b. With a set of control signals like this applied to the attenuator of FIG. 3d, attenuation versus Vctrl having a constant slope as shown in FIG. 3e is achievable.

Figure 4C:
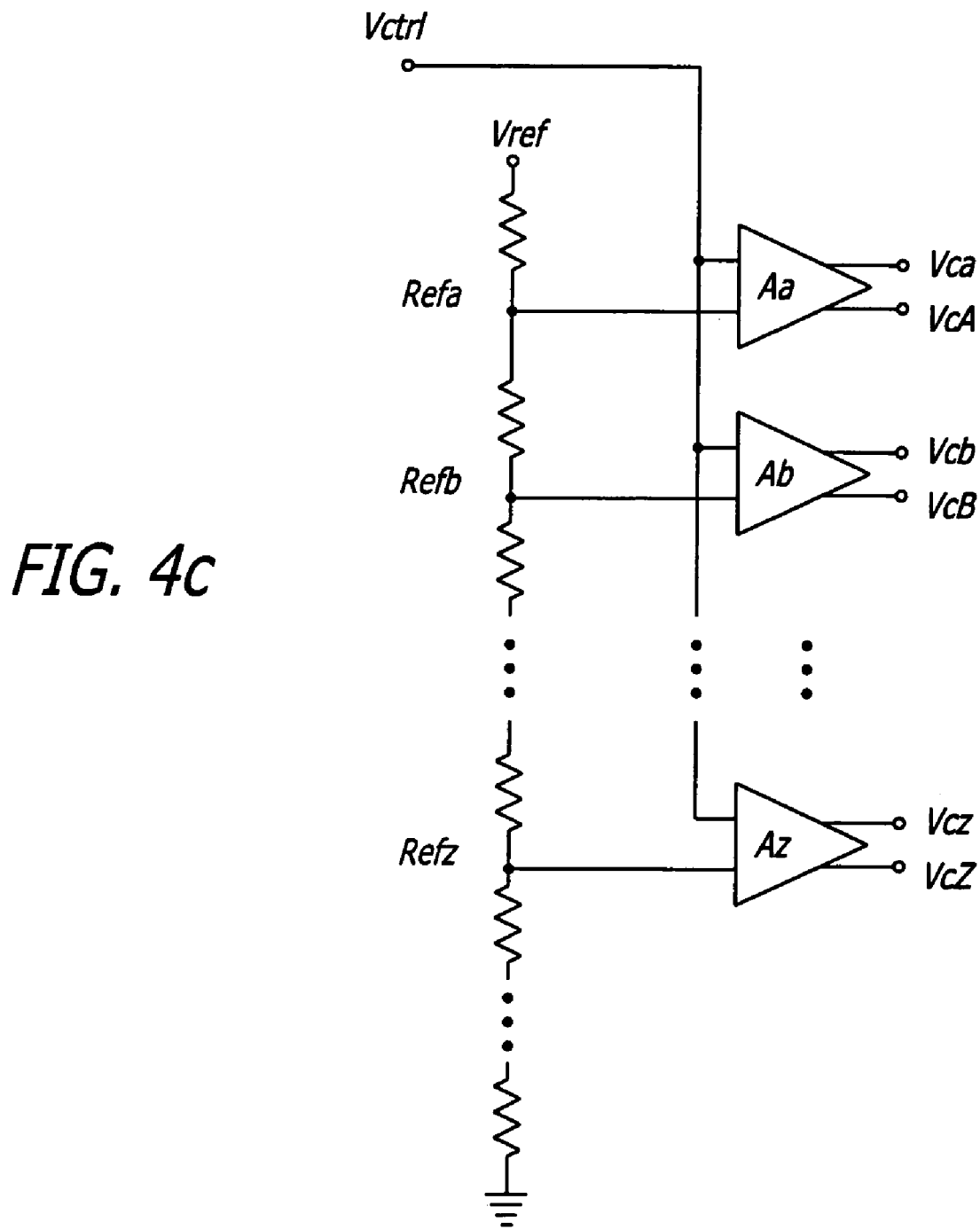
FIGS. 4c, 4d and 4e present a diagram illustrating how the sample control signals of FIG. 4b may be generated, a circuit that may be used for each of the amplifiers (Aa through Az) of FIG. 4c, and a graph illustrating the control signals Vcn and VcN generated by the circuits of FIGS. 4c and 4d, respectively.

The control signals Vca, Vcb . . . Vcy, Vcz may be generated from the control voltage Vctrl using a circuit such as that shown in FIG. 4c. In this embodiment, a resistors string is used to divide down a reference voltage Vref to provide a plurality of lower voltages Refa, Refb, . . . , Refz, each providing one input to a respective low gain, differential input, differential output amplifiers Aa, Ab, . . . , Az. The second input to each differential amplifiers is the control signal Vctrl, and the outputs are the differential signals Vca, VcA, Vcb, VcB, . . . , Vcz, VcZ. When the differential input to any one amplifier is zero, the differential output is preferably zero, with the two outputs preferably being at midrange, as may be seen in FIG. 4c. For good temperature and supply voltage rejection, Vref should be temperature and supply voltage stable, such as, by way of example, may be provided by a band gap reference.

Figure 4D:
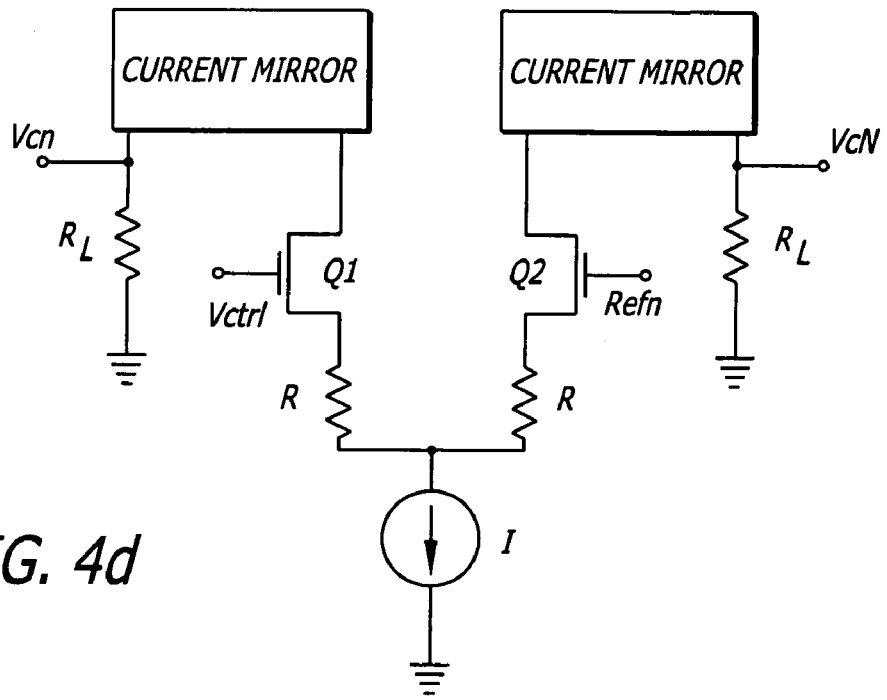
Figure 4E:
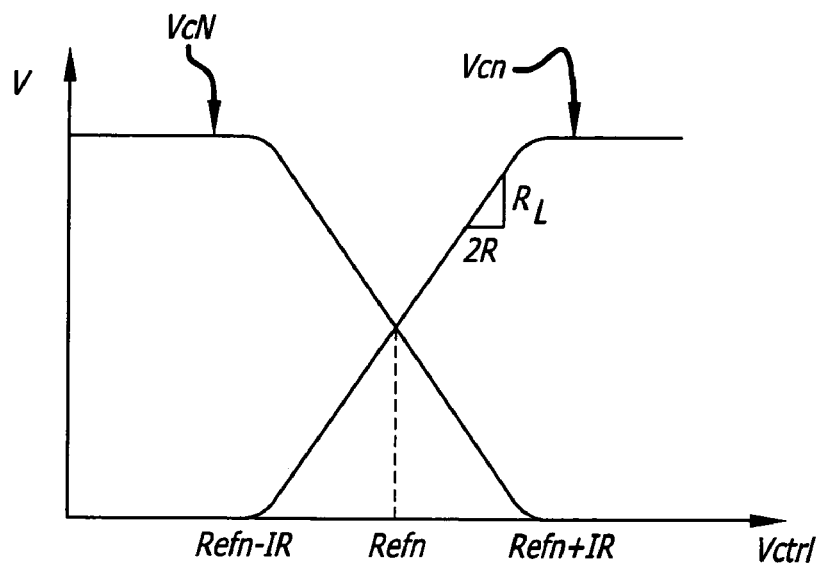

One suitable circuit for the amplifiers Aa, Ab, . . . , Az may be seen in FIG. 4d. In this circuit, transistors Q1 and Q2 have source degeneration resistors R to reduce the gain of the differential pair and to better linearize the output. The drain currents are mirrored to load resistors $R_L$ to provide the outputs Vcn, VcN. Current source I, preferably also temperature and supply voltage independent, determines the combined currents through the transistors. When Vctrl<Ref−IR, transistor Q1 will be off, and all the current I will flow through transistor Q2. When Vctrl>Refn+IR, transistor Q2 will be off, and all the current I will flow through transistor Q1. However, when (Refn−IR)<Vctrl<(Refn+IR), then Vcn and VcN will vary nearly linearly between their respective extremes (zero and $IR_L$ in this exemplary circuit) with a slope of $R_L/2R$. This is illustrated in FIG. 4e. The same circuit may be realized using other types of transistors, such as MESFETs, JFETs or bipolar junction transistors, or other circuits may be used as desired.

II. Temperature Dependence Reduction

Figure 5A:
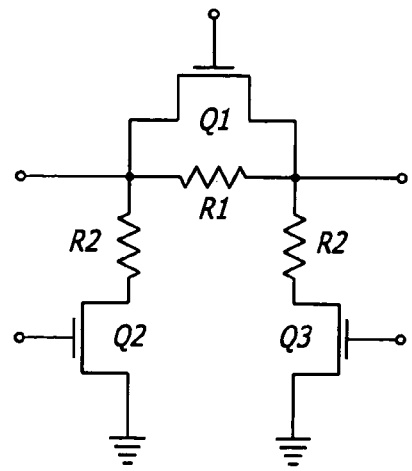
FIGS. 5a and 5b present a π-attenuator element or stage in accordance with the present invention and a graph illustrating its temperature dependence, respectively.
Figure 5B:
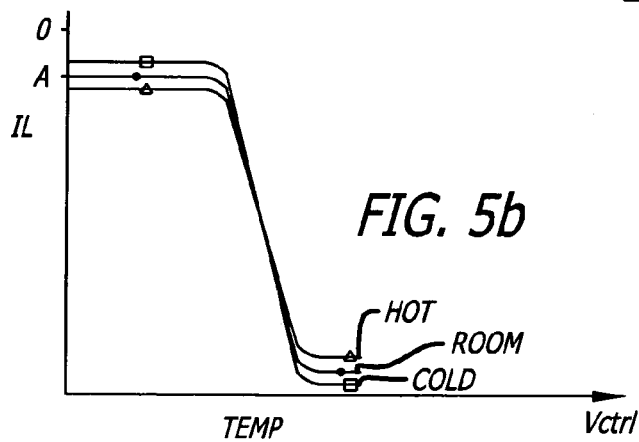
Figure 5C:
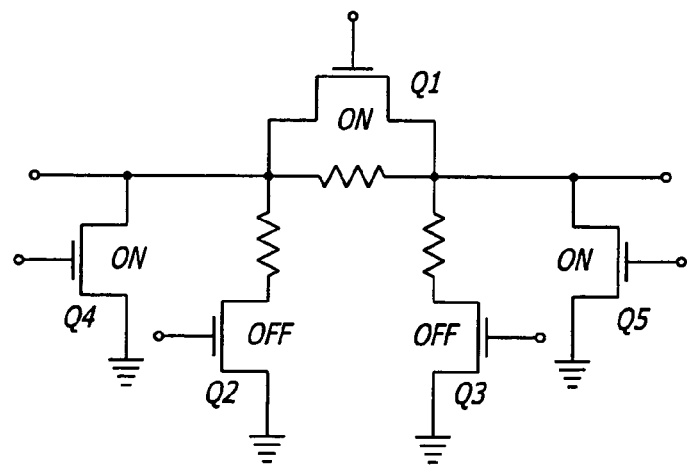
FIGS. 5c and 5d illustrate how the circuit of FIG. 5a may be compensated to reduce the temperature dependence at the lower attenuation levels by adding small transistors Q4 and Q5, and the effect of that compensation, respectively.
Figure 5D:
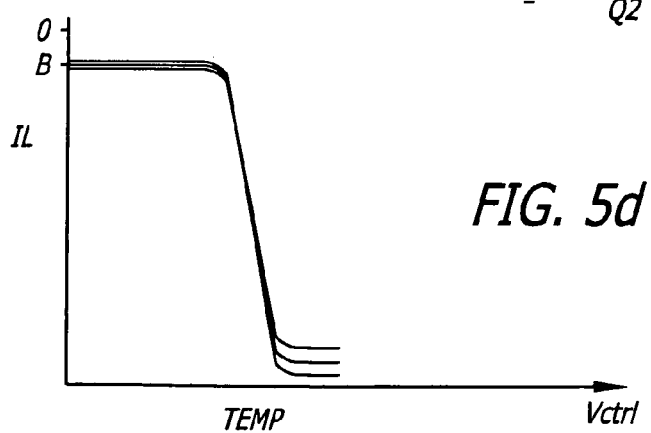

Now referring to FIGS. 5a and 5b, a π-attenuator element in accordance with the present invention and a graph illustrating its temperature dependence may be seen. The on resistance of a FET is temperature dependent, and increases with increasing temperature. Consequently with transistor Q1 on and transistors Q2 and Q3 off, the minimum insertion loss (IL) for the circuit will be lower for lower temperatures because of the lower combined resistance of resistor R1 and transistor Q1. With transistor Q1 off and transistors Q2 and Q3 on, the maximum insertion loss (IL) for the circuit will be higher for lower temperatures because of the lower series resistance of resistor R2 and transistor Q2, and resistor R2 and transistor Q3. The circuit may be compensated to reduce the temperature dependence on the lower attenuation levels by adding small transistors Q4 and Q5 compared to transistor Q1 as shown in FIG. 5c, and controlling them with the same control signal as is used to control transistor Q1. Transistors Q4 and Q5 introduce some additional loss, but in return, provide fairly high resistance paths to ground that vary with temperature to offset or compensate for the effect of the temperature variation of the resistance of transistor Q1 when it is on. The result is illustrated in FIG. 5d, wherein it may be seen that the temperature dependence of the insertion loss (IL) for low insertion loss is minimal, though the temperature dependence at high attenuation remains.

Figure 6A:
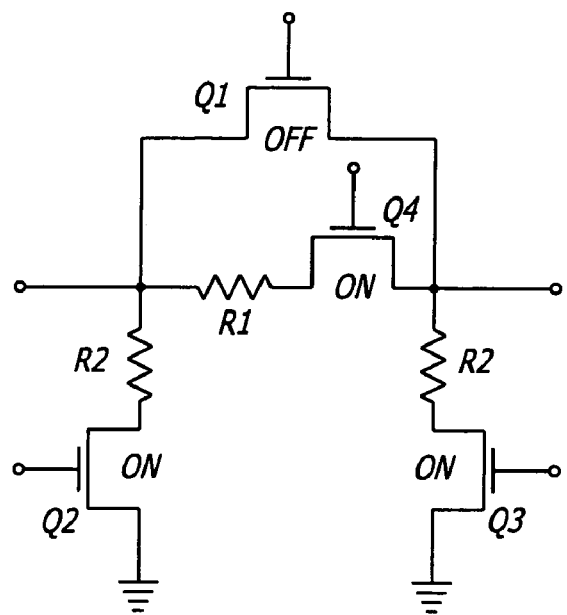
FIGS. 6a, 6b and 6c illustrate two different ways how the circuit of FIG. 5a may be temperature compensated at high attenuation, and the resulting insertion loss variation with temperature, respectively.
Figure 6B:
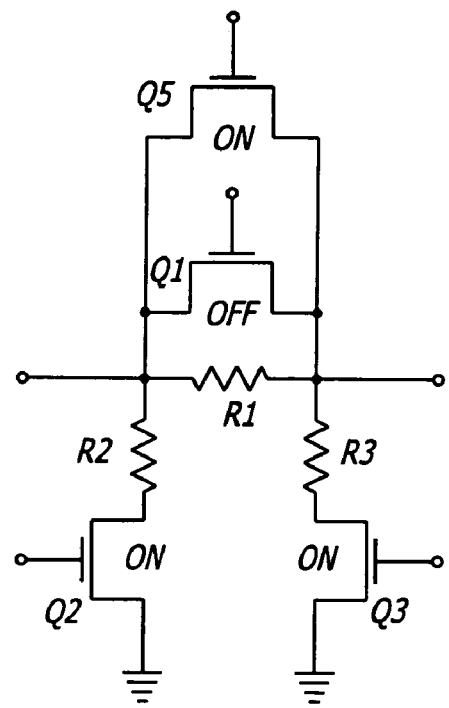
Figure 6C:
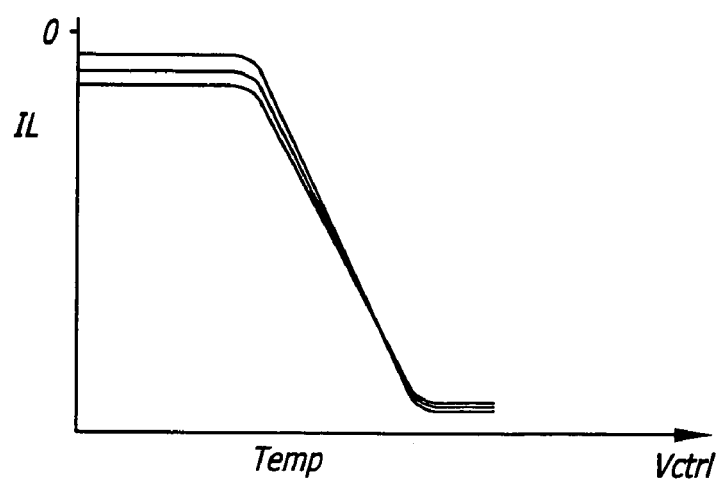

For temperature compensation at high attenuation for the circuit of FIG. 5a, either transistor Q4 may be added, as shown in FIG. 6a, or transistor Q5 may be added as shown in FIG. 6b. In FIG. 6a, transistor Q4 would be a large transistor (low on resistance) compared to transistors Q2 and Q3 which, when on, would compensate for the temperature variation of the on resistance of transistors Q2 and Q3. However, timing of the control of transistor Q4 is critical, so this circuit is not preferred for analog attenuators. In the circuit of FIG. 6b, transistor Q5 is a small transistor compared to transistors Q2 and Q3, and may be controlled by the same control signal as transistor Q3 to compensate for the temperature sensitivity of transistor Q3. In either case, the insertion loss variation with temperature will be as illustrated in FIG. 6c.

Temperature compensation for both high and low attenuation may be achieved by combining the foregoing circuit techniques. However, the chip area needed may become larger than desired, particularly when the following solution for higher power handling and linearity of FET attenuators are implemented. Consequently, compromises may often be made to achieve a good balance between the chip area required and performance needed. By way of example, in a closed loop automatic gain control application, the loop itself may provide adequate temperature compensation.

III. Higher Power Handling and High Linearity FET Attenuators

Two of the key figures of the merit of an attenuator are the power handling capability, measured by PldB (power in dB at the fundamental frequency), and the linearity, mainly measured by IP3 (third harmonics caused by nonlinearities). In most cases for integrated circuits, PldB and IP3 can be theoretically related to be 10 dB apart. Thus, optimizing PldB also optimizes IP3 in most cases.

Figure 7A:
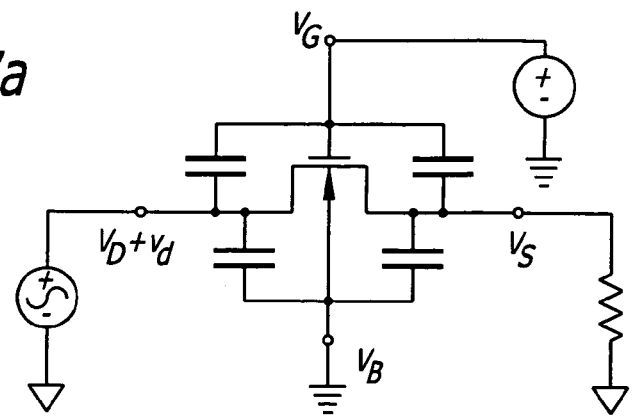
FIG. 7a shows a transistor, together with its intrinsic parasitic capacitances, biased in its linear region.
Figure 7B:
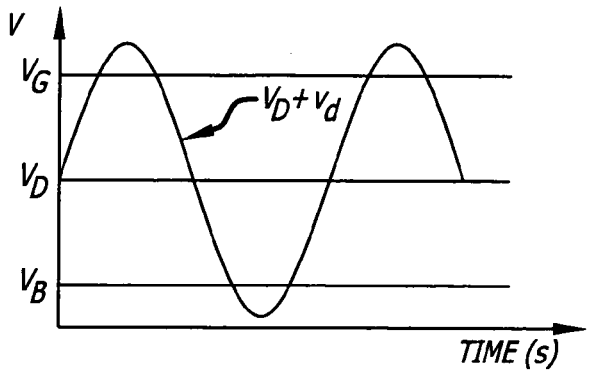
Figure 7C:
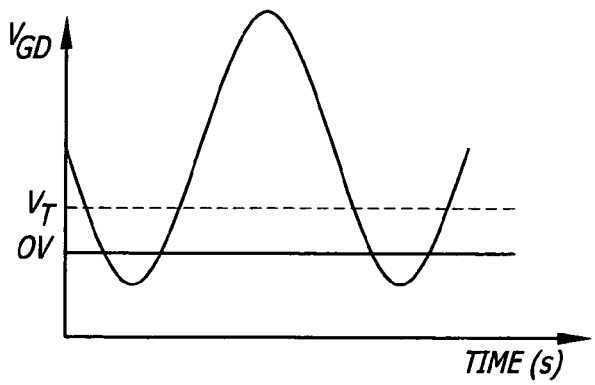

FIG. 7a shows a transistor, with its intrinsic parasitic capacitances, biased in its linear region. The gate ($V_G$) and body ($V_B$) nodes of the transfer are AC grounded in this case. The drain voltage may have a DC component $V_D$ plus a signal component $v_d$. As shown in FIG. 7b, with a large AC signal $v_d$ applied to the drain of the transistor, the large AC signal $v_d$ on top of the DC bias voltage $V_D$ at the drain node can either swing above the gate voltage $V_G$ or swing below the body voltage $V_B$ at some portion of the cycle. This can either turn off the transistor when it should be on as shown in FIG. 7c, or at least fluctuate the on-resistance of the transistor. These limit the PldB and IP3 of the transistors. FIG. 7c also shows that at some portion of the cycle, the voltage drop across the gate-to-drain/source/body oxide could be too high. This high voltage drop across the gate oxide can result in dielectric reliability issues.

Figure 7D:
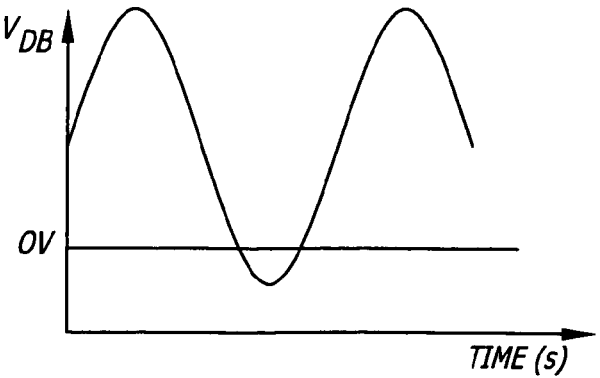

Similarly, as shown in FIG. 7d, the drain-to-body voltage may swing enough below ground voltage to forward bias the drain-to-body junction at some portion of the cycle. This forward biased drain-to-body junction causes signal distortion, and thus limits PldB and IP3. This forward biased junction may also trigger latch-up for circuits implemented using bulk silicon substrate technologies.

Figure 8A:
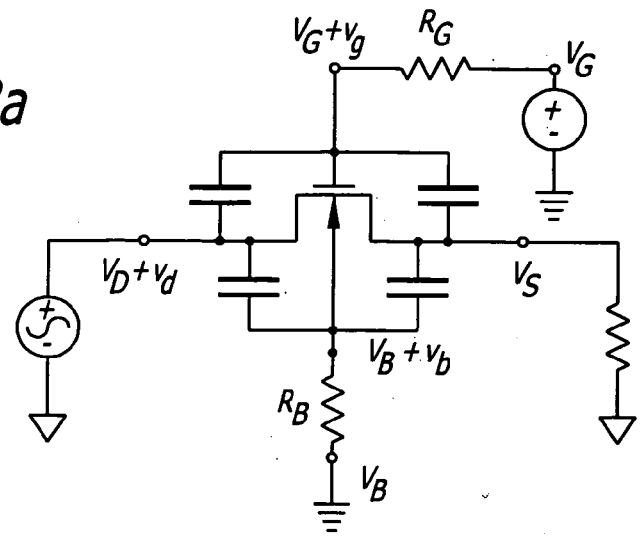
FIG. 8a illustrates the transistor of FIG. 7a, but with high impedance (relative to the capacitive impedances at the RF frequency of interest) gate bias and body bias connections.
Figure 8B:
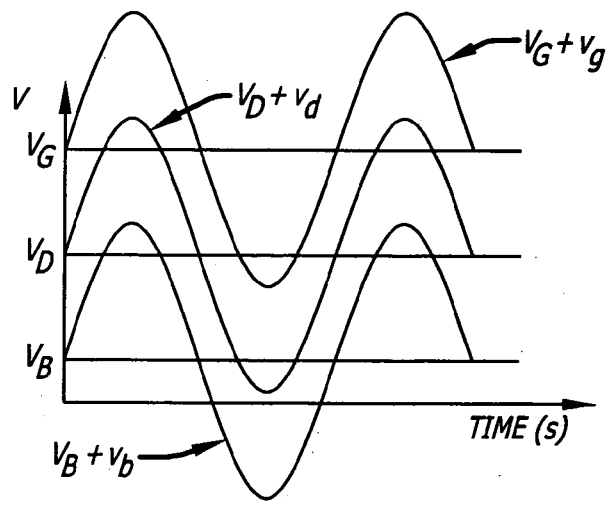
Figure 8C:
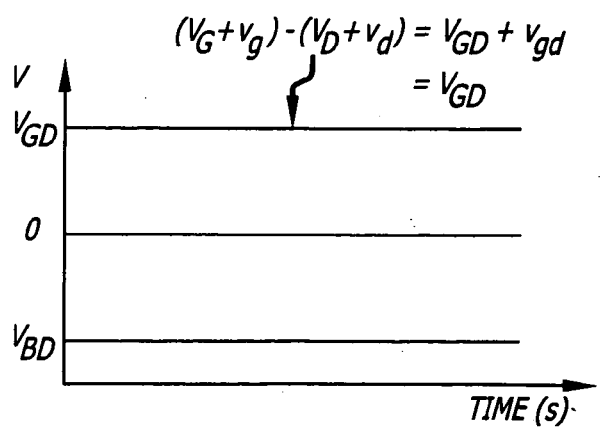

The requirement of reverse biased junction diodes, the unintentionally turned on or turned off transistor and also the dielectric reliability limitations all limit the power handling capability of the transistor. One approach to increase the power handling capability of the transistor is to use high impedance (relative to the capacitive impedances at the RF frequency of interest) gate bias and body bias connections as shown in FIG. 8a. The gate and body resistors $R_G$ and $R_B$ represent high impedance devices (substantially higher impedance than the respective parasitic capacitances at the frequencies of the AC signal) to provide AC isolation between the transistor gate and source nodes and their DC supply and ground, respectively. The existence of the high impedance device $R_G$ between the gate node and its bias allows the AC signal to be coupled to the gate node from the input through the parasitic capacitances, as illustrated in FIG. 8b. As shown in FIG. 8c, this coupled AC signal prevents the relative gate-to-drain voltage $V_{GD}$ (AC voltages plus DC voltages ($V_G+v_g$)−$V_D+v_d$)) of the transistor from fluctuating by causing the AC variation of the gate to drain voltage $v_{gd}$ to be negligible. In FIG. 8a, the body resistor is shown referenced to ground, though the same can be referenced to some other reference voltage provided care is taken to never forward bias either the source-body or the drain-body diode into conduction.

A similar mechanism also applies to the source/drain-to-body voltage. The existence of the high impedance devices, $R_G$ and $R_B$ in this case, maintains the DC bias point of the transistor even with a large AC signal at the source and drain nodes of the transistor. This, in turn, greatly enhances the PldB and also the IP3 of the transistors.

FIG. 7 and FIG. 8 provided examples for transistors biased in the linear region. This means that the DC source drain voltage (the DC source-to-drain bias) $V_{DS}$ of the transistors is low, preferably substantially zero. The high impedance coupling of the gate and body allow the gate and body to vary with the signal at the signal frequencies, so that the gate and body will swing or float with the signal. Thus while the drain source (drain-to-source) voltages of the FETs will vary with the signal when in the transition region, the variation will be within the linear region, so that the instantaneous current through a FET will be proportional to the instantaneous AC component of the voltage across the FET (like a resistor). To achieve a low or substantially zero DC source drain voltage on the transistors, the input and output voltages of an attenuator (or individual resistor subsequently described) should be balanced signals. By way of example, for a single ended attenuator such as shown in FIG. 3d, balanced signals may be obtained by making the common connection equal to the average input (and output) signal, or by AC (capacitively) coupling the input and output of the attenuator. For a differential attenuator like that of FIG. 13 to be described, the DC or average source drain voltage should automatically be substantially zero.

For small signal variable resistors and attenuators, the FET or FETs should be biased to operate in the linear region, or preferably with a substantially zero DC or average source drain voltage, but the gate and/or body may not need to be AC floated as described above.

For high PldB and IP3, it is also important for the transistors to remain off in the presence of large signals when biased in the off-state. However the concept demonstrated in FIG. 7 and FIG. 8 is also applicable to transistors biased in the off-state.

Given the technique to improve transistor PldB and IP3, the PldB and IP3 of the variable resistors schematically shown in FIG. 1 can be higher. This increases the PldB and IP3 of the attenuator shown in FIG. 3d. However, the worst case PldB and IP3 of the variable resistor does not occur when the transistors are biased in fully on or fully off regions. It was usually limited by a transistor biased in the transition from on to off states or the reverse transition. As shown in FIGS. 2b and 2d, with a slight Vc change, the effective impedance of the variable resistor in the transition region can change by a lot compared to the other two states (on and off) of the transistor. Because of this, the sequence of the control signals as shown in FIG. 4b has a substantial effect on the PldB and IP3 of this attenuator.

Figure 9A:
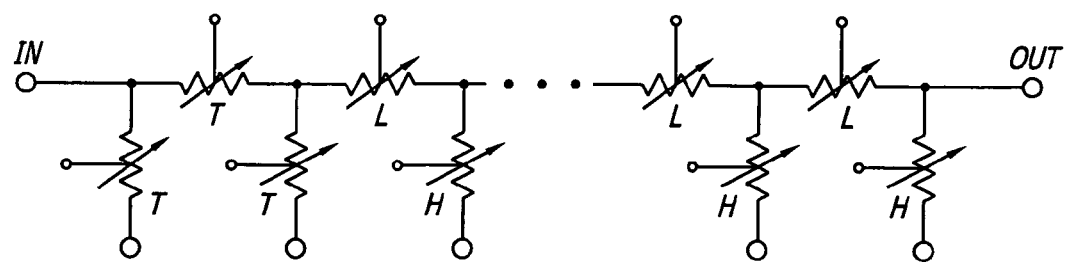
FIGS. 9a and 9b illustrate possible control sequences of the attenuator for lower attenuation and higher attenuation states, respectively.
Figure 9B:
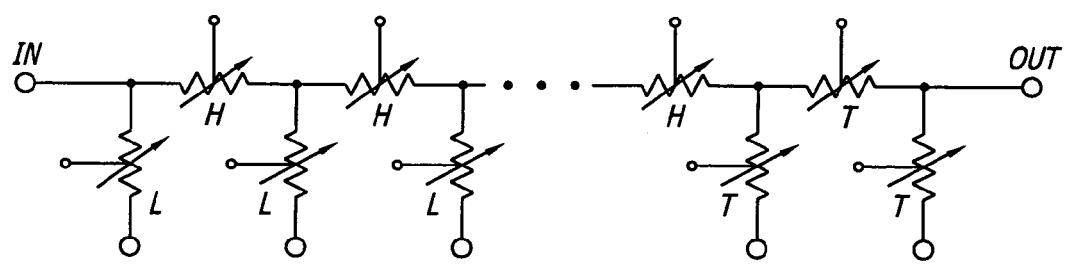

FIGS. 9a and 9b show a possible control sequence of the attenuator in both lower attenuation and higher attenuation states. For minimum attenuation (FIG. 9a), the variable resistors in series between the IN and OUT nodes are in the low impedance state L (the transistors are on) and the variable resistors coupled to ground are in the high impedance state H (the transistors are off). The attenuation is increased by switching the variable resistors, thus the transistors, from lower impedance state (L) to higher impedance state (H) through transition region (T), or H to T to L, in a controlled sequence. The control sequence starts from the variable resistors near the IN node and progresses to those near the OUT node in this example. As shown in FIG. 9a, under lower attenuation conditions, the variable resistors near the IN node are shifted into transition T, and this limits the input P1dB and IP3 of the attenuator under lower attenuation conditions.

At higher attenuation, the variable resistors near the IN node will have been switched to either H or L and the P1dB and the IP3 are limited by the variable resistors in the T region near the OUT node, as shown in FIG. 9b. The output P1dB in both lower attenuation and higher attenuation cases is similar if the minimum insertion loss of the attenuator is negligible. However, the input P1dB (output P1dB plus attenuation) under higher attenuation will be higher. If the transition sequence from IN to OUT is reversed, the input P1dB at low attenuation can be higher but the input P1dB at higher attenuation will be similar and thus the output P1dB reduces to the input P1dB minus the attenuation. This is much lower than the previous case and is usually not desired.

Figure 10:
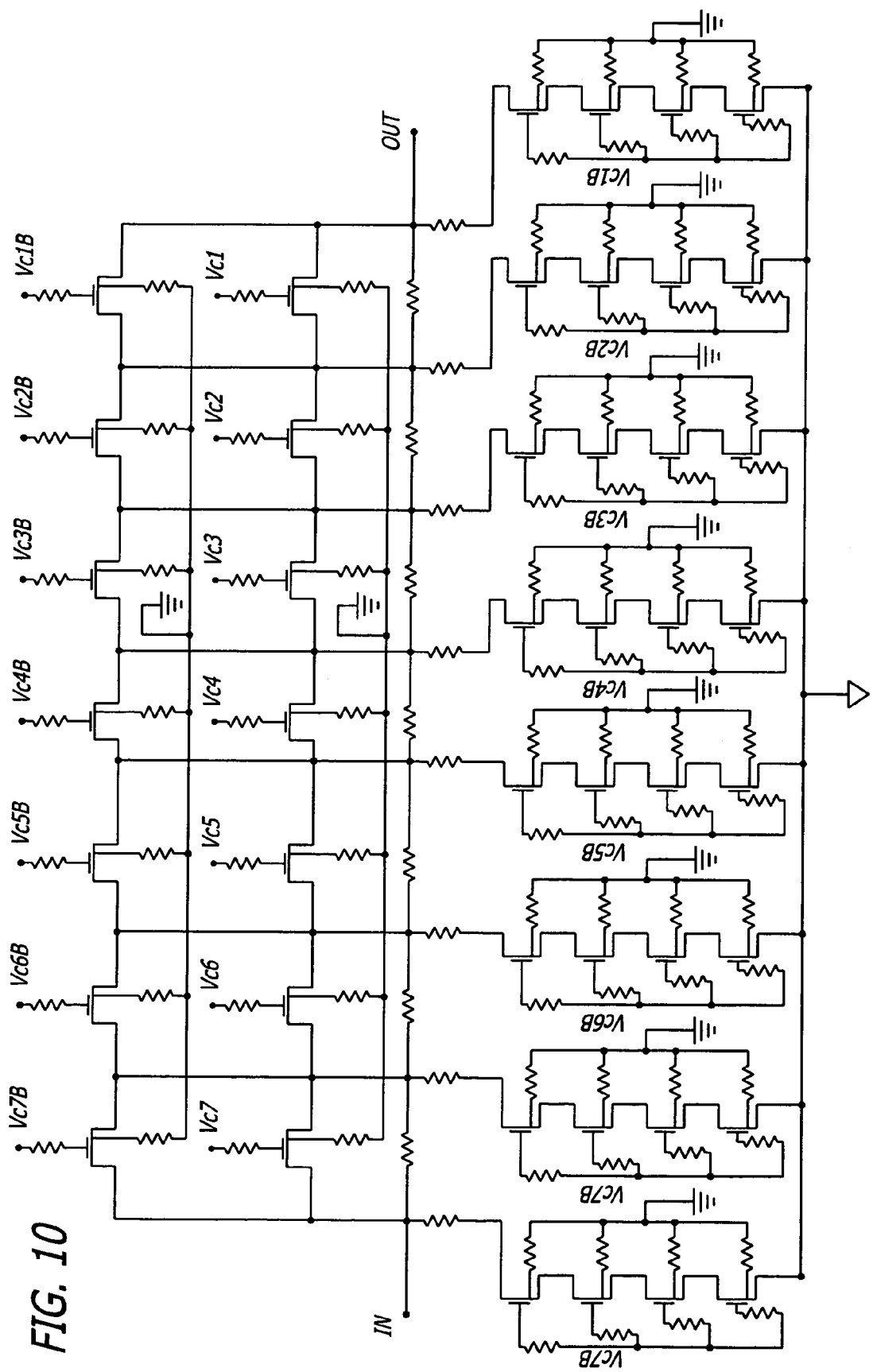
FIG. 10 is a circuit diagram for an exemplary embodiment of attenuator in accordance with the present invention.

Now referring to FIG. 10, a circuit diagram for an exemplary embodiment of attenuator in accordance with the present invention may be seen. In this attenuator, the control signals are Vc1 through Vc7 and their complements Vc1B through Vc7B. "Each" shunt transistor to AC ground is actually comprised of four transistors in series, mainly to improve the power handling and linearity due to unintentional turning on/off of shunt transistors at high input power. Also, this improves dielectric reliability at high input power by reducing the voltage drop across each transistor. The body of each of these transistors is coupled through a high impedance resistor (compared to the impedance of the parasitic capacitances at the RF frequency) to AC ground as shown. The main attenuator control transistors are the shunt transistors and the transistors controlled by the control signals Vc1 through Vc7, the transistors in parallel with the transistors controlled by the control signals Vc1 through Vc7 being small transistors to compensate for the temperature sensitivity of the on resistance of the shunt transistors (FIG. 6b), the specific attenuator shown in FIG. 10 not further incorporating temperature compensation.

In any attenuator in accordance with the present invention, the number of stages used will mainly depend on the desired dynamic range, attenuation slope, smoothness of the slope, minimum insertion loss, power handling capability and linearity. As an example, for 15 dB of dynamic range with ~1.2 dB minimum insertion loss, 38 dBm P1dB and a constant transition slope at 900 MHz, 7 stages have been used. For the same 15 dB dynamic range with ~0.7 dB insertion loss, 25 dBm P1dB and near-constant transition slope (with some bumps) at 900 MHz, only three stages were used. Also in most cases, the resistors and the transistors in the series branches will not be the same as the ones in the shunt branches, but all the resistors and transistors in the series branches for each stage are usually the same, and all the resistors and transistors in the shunt branches for each stage are usually the same, except the first and last shunt branches. This is good for input/output impedance matching. However in some cases where a taper attenuation curve for specific application is needed, the resistors and transistors in each stage will not be the same.

Figure 11:
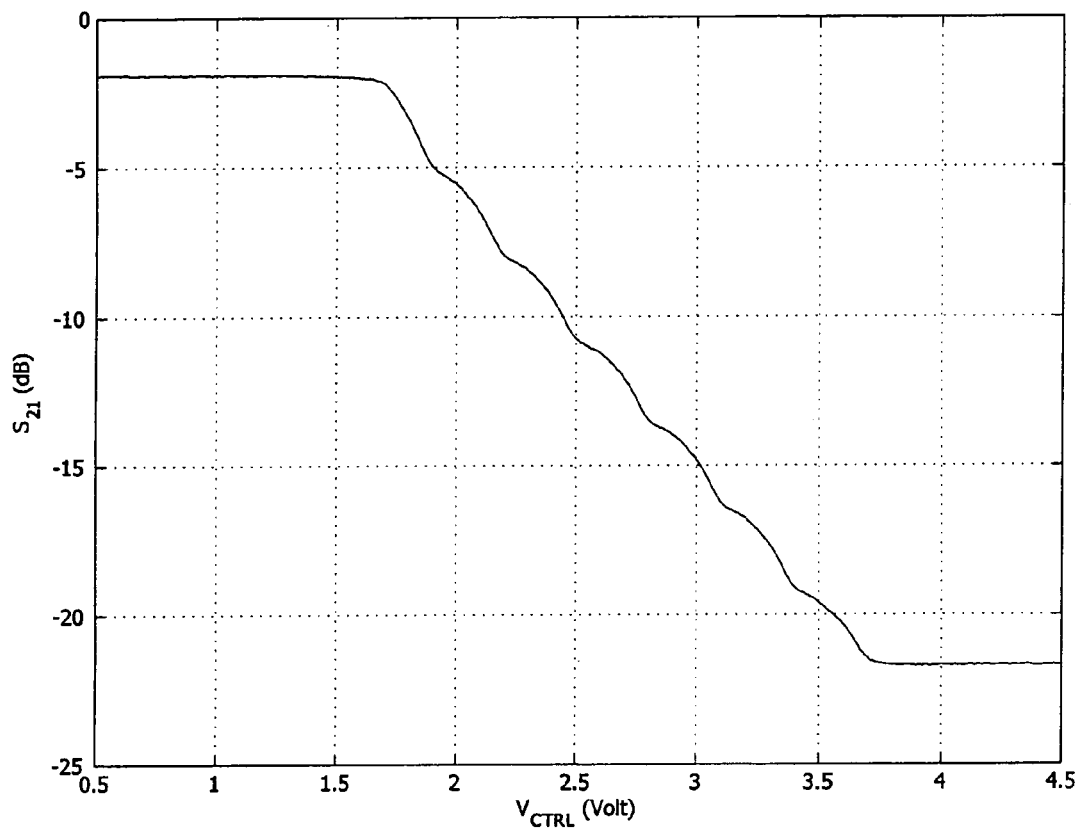
FIG. 11 presents an exemplary curve of attenuation vs attenuation control voltage for an attenuator in accordance with the present invention.

FIG. 11 presents an exemplary curve of attenuation vs attenuation control voltage for an attenuator in accordance with the present invention. This curve shows the attenuation versus attenuation control voltage for an analog attenuator consisting of seven sections. The ripple in the plot is contributed from each section of the attenuator. The slope of attenuation versus control voltage is monotonic and semi-constant. The ripple and slope can be improved by adding more sections, the trade off being the minimum insertion loss of the attenuator.

Figure 12:
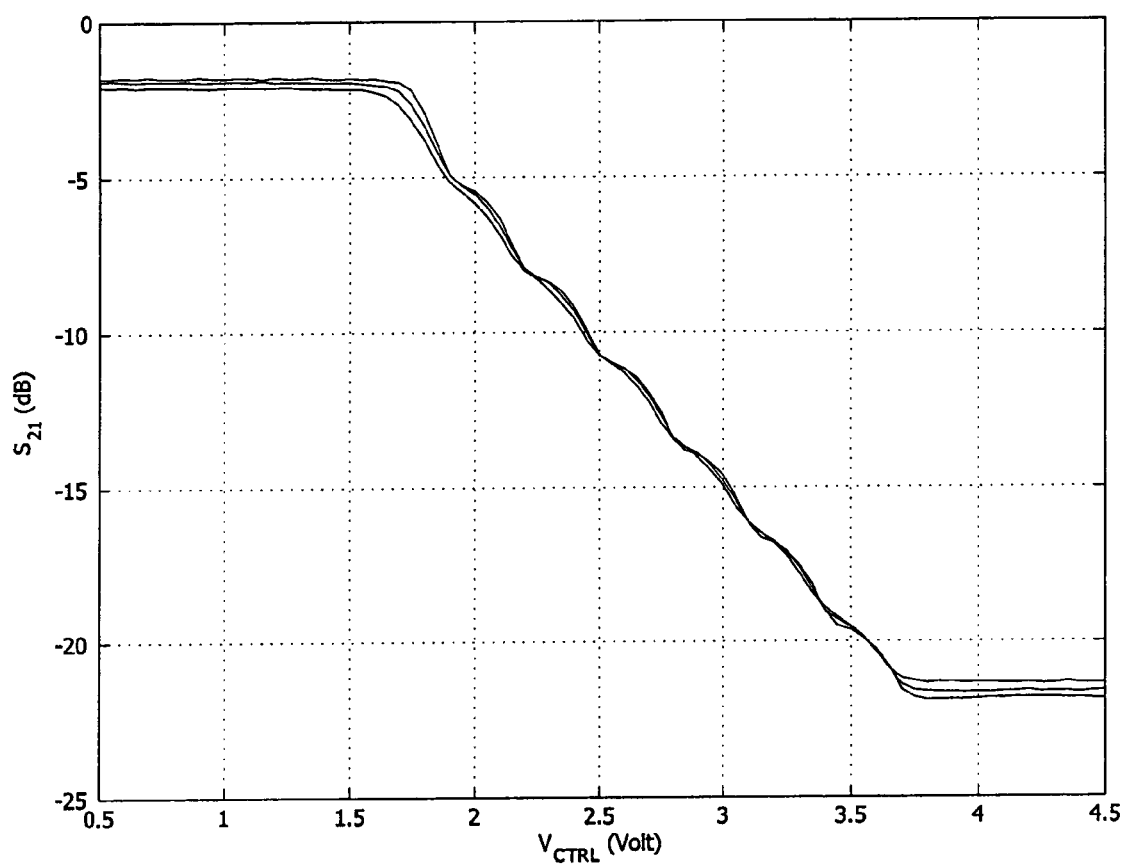
FIG. 12 presents exemplary curves of attenuation vs attenuation control voltage at three different temperatures for an attenuator in accordance with the present invention.

FIG. 12 presents exemplary curves of attenuation vs attenuation control voltage at three different temperatures for an attenuator in accordance with the present invention. The three curves in this plot show the attenuation curve at −40, 25 and 85° C., respectively. This attenuator includes high attenuation temperature compensation to reduce the attenuation variation to +/−0.5 dB. If the temperature compensation is not utilized, the attenuation variation versus temperature at high attenuation is expected to be around +/−1.5 dB.

Figure 13:
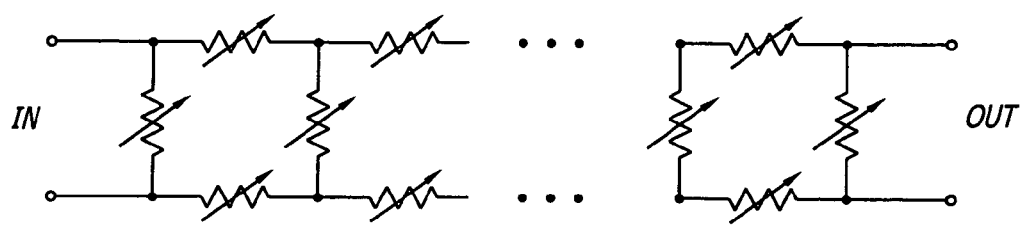
FIG. 13 illustrates a differential or double ended variable attenuator in accordance with the present invention.

FIG. 13 illustrates a differential or double ended variable attenuator in accordance with the present invention. This circuit, like the single ended attenuator of FIG. 3d, may use any of the variable resistances disclosed herein, or variable resistances of other circuit configurations using one or more FETs as desired, provided the FETs have their bodies coupled to ground or some other reference voltage through an impedance, typically a resistance, that is higher than the impedance of the body parasitic capacitances at the signal frequencies to be attenuated, and have their gates coupled to a control voltage through an impedance, also typically a resistance, that is higher than the impedance of the gate parasitic capacitances at the signal frequencies to be attenuated. Preferably, but not necessarily, the impedances coupling the body to its reference voltage and the gate to its control voltage are an order of magnitude (10 times) the associated parasitic impedances.

Figure 14:
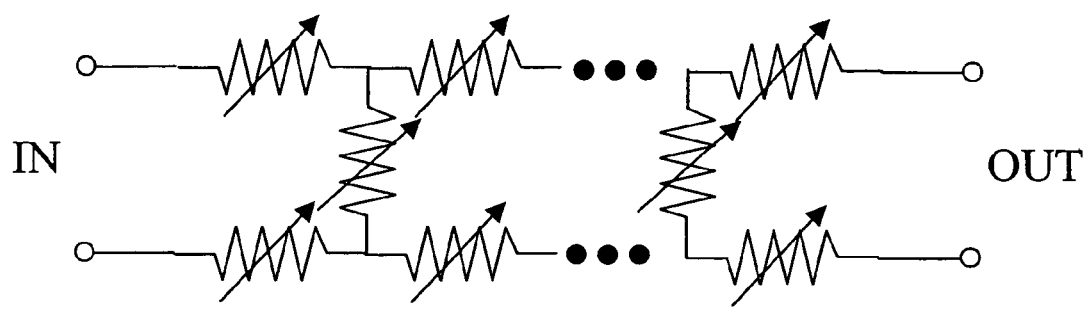
FIG. 14 illustrates an alternate embodiment differential or double ended variable attenuator in accordance with the present invention.

FIG. 14 illustrates an alternate embodiment differential or double ended variable attenuator in accordance with the present invention. This embodiment differs from the embodiment of FIG. 13 in that the variable resistors at the ends of the attenuator are series variable resistors, not shunt variable resistors. In that regard, the phrase alternate series and shunt variable resistors as used in the claims to follow does not suggest either particular type of variable resistor (series and shunt) at the ends of an attenuator, single ended or differential, or for that matter, that the two ends of the attenuator have the same type of variable resistor, though that will usually be the case.

Figure 15:
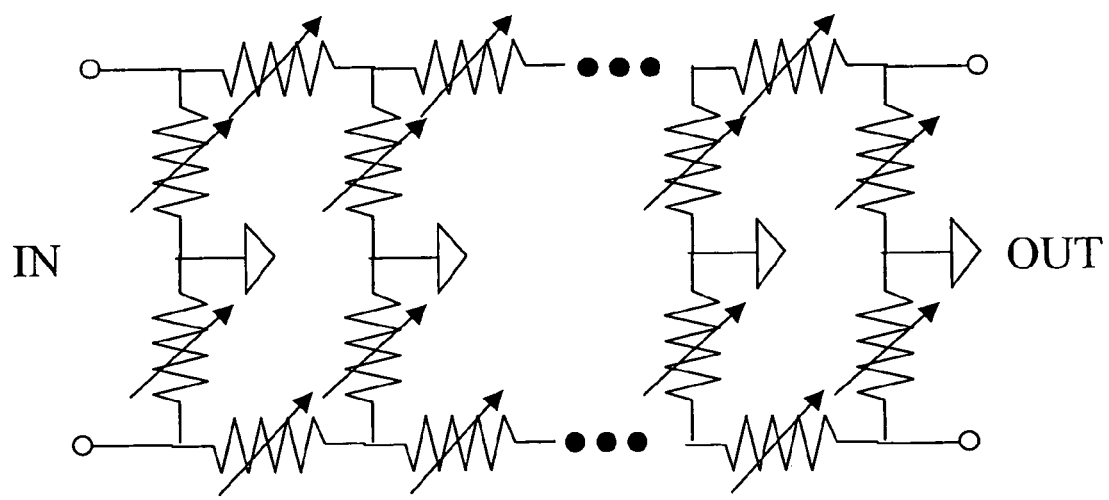
FIG. 15 illustrates a still further alternate embodiment differential or double ended variable attenuator in accordance with the present invention.

FIG. 15 illustrates a still further alternate embodiment differential or double ended variable attenuator in accordance with the present invention. This embodiment is similar to that of FIG. 13, though with each shunt variable resistor being comprised of two shunt variable resistor portions with a common mode AC ground between each pair of shunt variable resistor portions. Each shunt variable resistor portion in each pair would normally be identical variable resistor portions, with each variable resistor portion in a respective pair of variable resistor portions being coupled to the same respective control voltage.

It should be noted that the present invention has been disclosed in conjunction with analog attenuators having a substantial attenuation range. However the principles of the present invention are also applicable to single variable resistances as well as single stage π-attenuators and T-attenuators, which may be useful in applications that do not require a wide range of control, or where a variable resistor is needed for some other purpose. Also, in some applications, it may be appropriate to distribute the stages of a multistage attenuator along an analog signal path, using one or more stages at various locations along the signal path.

This could preserve the overall attenuation range, though allow each analog signal processing element to operate at its optimum signal to noise ratio.

There have been disclosed herein analog control integrated FET based variable resistances and attenuators, as well as methods and circuits for temperature compensation and for minimization of large signal distortion. The advantages of these integrated attenuators include smaller size, less expensive, less power consumption and constant attenuation versus control voltage slope compared to conventional discrete PIN diode based analog attenuators. These attenuators can be integrated in most of the available integrated circuit technologies. Because of this, this invention enables the integration of the analog control variable attenuator with other circuits and thus greatly reduces the size and cost for circuits requires this function.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features.

What is claimed is:

1. A variable attenuator for controllably attenuating an AC signal comprising:
    a plurality of alternate series and shunt variable resistors coupled between a variable attenuator input and a variable attenuator output, each variable resistor having at least one field effect transistor (FET) having a body, a source, a drain and a gate, with parasitic capacitances between the gate and source, the gate and drain, the source and body and the drain and body, the parasitic capacitances providing respective parasitic impedances at the frequencies of the AC signal;
    the body of each FET being coupled to a circuit reference through a respective resistance having an impedance higher than the parasitic impedances to the body;
    the gate of each FET being coupled to a respective control voltage through a respective resistance having an impedance higher than the parasitic impedances to the gate;
    each FET being biased to operate in its linear region; and
    a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation.

2. The attenuator of claim 1 wherein the reference voltage is a circuit ground.

3. The attenuator of claim 1 wherein the attenuator is a single ended attenuator.

4. The attenuator of claim 1 wherein the attenuator is a differential attenuator.

5. The attenuator of claim 1 wherein a DC source-to-drain voltage of each of the FETs is substantially zero.

6. The attenuator of claim 1 wherein each of the shunt variable resistors comprises a FET in series with a resistor.

7. A variable attenuator for controllably attenuating an AC signal comprising:
    a plurality of alternate series and shunt variable resistors coupled between a variable attenuator input and a variable attenuator output, each variable resistor having at least one field effect transistor (FET) having a body, a source, a drain and a gate, with parasitic capacitances between the gate and source, the gate and drain, the source and body and the drain and body, the parasitic capacitances providing respective parasitic impedances at the frequencies of the AC signal, each of the series variable resistor comprising a FET in parallel with a resistor;
    the body of each FET being coupled to a circuit reference through a respective resistance having an impedance higher than the parasitic impedances to the body;
    the gate of each FET being coupled to a respective control voltage through a respective resistance having an impedance higher than the parasitic impedances to the gate;
    each FET being biased to operate in its linear region; and
    a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation.

8. A variable attenuator for controllably attenuating an AC signal comprising:
    a plurality of alternate series and shunt variable resistors coupled between a variable attenuator input and a variable attenuator output, each variable resistor having at least one field effect transistor (FET) having a body, a source, a drain and a gate, with parasitic capacitances between the gate and source, the gate and drain, the source and body and the drain and body, the parasitic capacitances providing respective parasitic impedances at the frequencies of the AC signal, each of the shunt variable resistors comprising a FET in series with a resistor and each series variable resistor comprising a FET in parallel with a resistor;
    the body of each FET being coupled to a circuit reference through a respective resistance having an impedance higher than the parasitic impedances to the body;
    the gate of each FET being coupled to a respective control voltage through a respective resistance having an impedance higher than the parasitic impedances to the gate;
    each FET being biased to operate in its linear region; and
    a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation.

9. The attenuator of claim 8 further comprised of second FETs, each in parallel with a respective shunt variable resistor, each second FET being small in comparison with the FETs in the series variable resistors and each being controlled in unison with a FET in a series variable resistor.

10. The attenuator of claim 8 further comprised of second FETs, each in parallel with the FET in a series variable resistor, each second FET being small in comparison with the FETs in the shunt variable resistors and each being controlled in unison with a FET in a shunt variable resistor.

11. The attenuator of claim 8 further comprised of second FETs, each in series with a resistor, each series combination of a second FET and a respective resistor being coupled in parallel with the FET in a respective series variable resistor.

12. The attenuator of claim 11 wherein each second FET is large in comparison with the FETs in the shunt variable resistors and each second FET being controlled in unison with a FET in a shunt variable resistor.

13. A variable attenuator for controllably attenuating an AC signal comprising:
a plurality of alternate series and shunt variable resistors coupled between a variable attenuator input and a variable attenuator output, each variable resistor having at least one field effect transistor (FET) having a body, a source, a drain and a gate, with parasitic capacitances between the gate and source, the gate and drain, the source and body and the drain and body, the parasitic capacitances providing respective parasitic impedances at the frequencies of the AC signal;
the body of each FET being coupled to a circuit reference through a respective resistance having an impedance higher than the parasitic impedances to the body;
the gate of each FET being coupled to a respective control voltage through a respective resistance having an impedance higher than the parasitic impedances to the gate;
each FET being biased to operate in its linear region; and
a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation, the FET gate control circuit comprising a voltage divider dividing a reference voltage into a plurality of lower voltage references, and a plurality of differential amplifiers, each differential amplifier providing a differential output responsive to the difference between a respective reference and the attenuator control signal.

14. The attenuator of claim 13 wherein;
each differential amplifier comprises first and second transistors, each having first and second terminals and a control terminal, the conduction between the first and second terminals being responsive to the voltage between the control terminal and the first terminal, the first terminals of the first and second transistors each being coupled to a current source through a respective resistor, the second terminals of the first and second transistors each being coupled to a respective current mirror, each current mirror being coupled to a respective load resistor;
the voltages across the load resistors controlling the FETS in the series and shunt variable resistors.

15. The attenuator of claim 14 wherein the first and second transistors are FETs.

16. The attenuator of claim 14 wherein the first and second transistors are bipolar junction transistors.

17. A variable attenuator for controllably attenuating an AC signal comprising:
a plurality of alternate series and shunt variable resistors coupled between a variable attenuator input and a variable attenuator output, each variable resistor having at least one field effect transistor (FET) having a source, a drain and a gate;
each FET being biased to operate in its linear region; and
a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation.

18. The attenuator of claim 17 wherein a DC source-to-drain voltage of each of the FETs is substantially zero.

19. A variable attenuator for controllably attenuating an AC signal comprising:
a plurality of alternate series and shunt variable resistors coupled between a variable attenuator input and a variable attenuator output, each variable resistor having at least one field effect transistor (FET) having a source, a drain and a gate,;
each FET being biased to operate in its linear region; and
a FET gate control circuit controlling the gate of each field effect device responsive to an attenuator control signal, the FET gate control turning on the FETs in the shunt variable resistors and turning off the FETs in the series variable resistors progressively and at predetermined rates to monotonically increase the attenuation of the AC signal from a minimum to a maximum attenuation, and turning off the FETs in the shunt variable resistors and turning on the FETs in the series variable resistors progressively and at predetermined rates to monotonically decrease the attenuation of the AC signal from the maximum attenuation to the minimum attenuation, the FET gate control circuit comprising a voltage divider dividing a reference voltage into a plurality of lower voltage references, and a plurality of differential amplifiers, each differential amplifier providing a differential output responsive to the difference between a respective reference and the attenuator control signal.

20. The attenuator of claim 19 wherein:
each differential amplifier comprises first and second transistors, each having first and second terminals and a control terminal, the conduction between the first and second terminals being responsive to the voltage between the control terminal and the first terminal, the first terminals of the first and second transistors each being coupled to a current source through a respective resistor, the second terminals of the first and second transistors each being coupled to a respective current mirror, each current mirror being coupled to a respective load resistor;
the voltages across the load resistors controlling the FETS in the series and shunt variable resistors.

* * * * *